United States Patent
Bulovic et al.

(10) Patent No.: US 6,809,955 B2
(45) Date of Patent: Oct. 26, 2004

(54) ADDRESSABLE AND ELECTRICALLY REVERSIBLE MEMORY SWITCH

(75) Inventors: Vladimir Bulovic, Cambridge, MA (US); Aaron Mandell, Boston, MA (US); Andrew Perlman, Boston, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 49 days.

(21) Appl. No.: 10/139,746

(22) Filed: May 7, 2002

(65) Prior Publication Data

US 2002/0163829 A1 Nov. 7, 2002

Related U.S. Application Data

(60) Provisional application No. 60/289,057, filed on May 7, 2001.

(51) Int. Cl.⁷ .................................. G11C 13/00
(52) U.S. Cl. ................. 365/151; 365/100; 365/148; 257/E51.006
(58) Field of Search ................. 365/100, 148, 365/151; 257/E51.006, E29.17

(56) References Cited

U.S. PATENT DOCUMENTS

| | | | |
|---|---|---|---|
| 3,719,933 A | 3/1973 | Wakabayashi et al. | |
| 3,810,127 A | 5/1974 | Hoff, Jr. | |
| 4,267,558 A | 5/1981 | Guterman | |
| 4,267,583 A | 5/1981 | Suzuki | |

(List continued on next page.)

FOREIGN PATENT DOCUMENTS

| | | |
|---|---|---|
| DE | 196 40 239 A1 | 4/1998 |
| DE | 199 59 904 A1 | 6/2001 |
| EP | 0 268 370 A3 | 5/1988 |
| EP | 0268370 A2 | 5/1988 |
| EP | 0 385 688 A2 | 9/1990 |
| EP | 0 727 822 A2 | 8/1996 |
| JP | 7-106440 | 4/1995 |
| RU | 2071126 C1 | 12/1996 |
| WO | WO 93/04506 A1 | 3/1993 |
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

"A Disrupted Organic Film: Could Memories Be Made of This?," *ORNL Review*, vol. 33, No. 2, 2000.

"Technical Summary of Programmable Metallization Cell Memory Technology," Version 1.3, Dec. 2001.

(List continued on next page.)

*Primary Examiner*—Son Mai
(74) *Attorney, Agent, or Firm*—Amin & Turocy, LLP

(57) ABSTRACT

A novel switching device is provided with an active region arranged between first and second electrodes and including a molecular system and ionic complexes distributed in the system. A control electrode is provided for controlling an electric field applied to the active region, which switches between a high-impedance state and a low-impedance state when the electrical field having a predetermined polarity and intensity is applied for a predetermined time.

48 Claims, 3 Drawing Sheets

U.S. PATENT DOCUMENTS

| | | | |
|---|---|---|---|
| 4,371,883 | A | 2/1983 | Potember et al. |
| 4,616,340 | A | 10/1986 | Hayashi et al. |
| 4,631,562 | A | 12/1986 | Avery |
| 4,652,894 | A | 3/1987 | Potember et al. |
| 4,677,742 | A | 7/1987 | Johnson |
| 4,727,514 | A | 2/1988 | Bhuva et al. |
| 4,733,375 | A | 3/1988 | Terashima |
| 4,834,911 | A | 5/1989 | Carew |
| 4,839,700 | A | 6/1989 | Ramesham et al. |
| 4,860,254 | A | 8/1989 | Pott et al. |
| 5,012,445 | A | 4/1991 | Kazuaki et al. |
| 5,034,192 | A | 7/1991 | Wrighton et al. |
| 5,130,380 | A | 7/1992 | Carew |
| 5,136,212 | A | 8/1992 | Eguchi et al. |
| 5,153,681 | A | 10/1992 | Kishimoto et al. |
| 5,196,912 | A | 3/1993 | Matsumoto et al. |
| 5,206,525 | A | 4/1993 | Yamamoto et al. |
| 5,245,543 | A | 9/1993 | Smayling et al. |
| 5,296,716 | A | 3/1994 | Ovshinsky et al. |
| 5,315,131 | A | 5/1994 | Kishimoto et al. |
| 5,319,564 | A | 6/1994 | Smayling et al. |
| 5,355,235 | A | 10/1994 | Nishizawa et al. |
| 5,392,236 | A | 2/1995 | Hashimoto |
| 5,412,614 | A | 5/1995 | Bird |
| RE34,974 | E | 6/1995 | Terashima |
| 5,431,883 | A | 7/1995 | Barraud |
| 5,440,518 | A | 8/1995 | Hazani |
| 5,563,081 | A | 10/1996 | Ozawa |
| 5,572,472 | A | 11/1996 | Kearney et al. |
| 5,579,199 | A | 11/1996 | Kawamura et al. |
| 5,670,818 | A | 9/1997 | Forouhi et al. |
| 5,691,935 | A | 11/1997 | Douglass |
| 5,698,874 | A | 12/1997 | Hayashi |
| 5,734,605 | A | 3/1998 | Zhu et al. |
| 5,761,115 | A | 6/1998 | Kozicki et al. |
| 5,770,885 | A | 6/1998 | McCollum et al. |
| 5,818,749 | A | 10/1998 | Harshfield |
| 5,849,403 | A * | 12/1998 | Aoki et al. .............. 428/220 |
| 5,869,882 | A | 2/1999 | Chen et al. |
| 5,896,312 | A | 4/1999 | Kozicki et al. |
| 5,900,662 | A | 5/1999 | Frisina et al. |
| 5,914,893 | A | 6/1999 | Kozicki et al. |
| 5,930,162 | A * | 7/1999 | Peterson .................. 365/151 |
| 6,055,180 | A | 4/2000 | Gudesen et al. |
| 6,060,338 | A | 5/2000 | Tanaka et al. |
| 6,064,589 | A | 5/2000 | Walker |
| 6,088,319 | A | 7/2000 | Gudesen |
| 6,118,684 | A | 9/2000 | Yihong et al. |
| 6,128,214 | A | 10/2000 | Kuekes et al. |
| 6,150,705 | A | 11/2000 | Chen |
| 6,288,697 | B1 | 9/2001 | Eto et al. |
| 6,292,396 | B1 | 9/2001 | Tailliet |
| 6,326,936 | B1 | 12/2001 | Inganas et al. |
| 6,349,054 | B1 | 2/2002 | Hidaka |
| 6,353,559 | B2 | 3/2002 | Hasegawa et al. |
| 6,384,427 | B1 | 5/2002 | Yamazaki et al. |
| 6,403,396 | B1 | 6/2002 | Gudesen et al. |
| 6,403,397 | B1 | 6/2002 | Katz |
| 6,407,953 | B1 | 6/2002 | Cleeves |
| 6,418,049 | B1 | 7/2002 | Kozicki et al. |
| 6,424,553 | B2 | 7/2002 | Berggren et al. |
| 6,426,891 | B1 | 7/2002 | Katori |
| 6,429,457 | B1 | 8/2002 | Berggren et al. |
| 6,432,739 | B1 | 8/2002 | Gudesen et al. |
| 6,449,184 | B2 | 9/2002 | Kato et al. |
| 6,459,095 | B1 | 10/2002 | Heath et al. |
| 6,461,916 | B1 | 10/2002 | Adachi et al. |
| 6,487,106 | B1 | 11/2002 | Kozicki et al. |
| 6,548,843 | B2 * | 4/2003 | Wickramasinghe et al. . 257/295 |
| 2001/0014038 | A1 | 8/2001 | Hasegawa et al. |
| 2001/0054709 | A1 | 12/2001 | Heath et al. |
| 2001/0055384 | A1 | 12/2001 | Yamazaki et al. |
| 2002/0027819 | A1 | 3/2002 | Tomanek et al. |
| 2002/0101763 | A1 | 8/2002 | Hosogane et al. |
| 2002/0104889 | A1 | 8/2002 | Forrest et al. |
| 2002/0125504 | A1 | 9/2002 | Perlov et al. |
| 2002/0134979 | A1 | 9/2002 | Yamazaki et al. |
| 2002/0163030 | A1 | 11/2002 | Mandell et al. |
| 2002/0163057 | A1 | 11/2002 | Bulovic et al. |
| 2002/0163828 | A1 | 11/2002 | Krieger et al. |
| 2002/0163829 | A1 | 11/2002 | Bulovic et al. |
| 2002/0163830 | A1 | 11/2002 | Bulovic et al. |
| 2002/0163831 | A1 | 11/2002 | Krieger et al. |
| 2002/0168820 | A1 | 11/2002 | Kozicki et al. |

OTHER PUBLICATIONS

"The 1998 Conference Archive," *The Sixth Foresight Conference on Molecular Nanotechnology*, Nov. 12–15, 1998, www.foresight.org/Conferences/MNT6/index.html.

Beck, A. et al., "Reproducible Switching Effect in Thin Oxide Films for Memory Applicatons," *Applied Physics Letters*, vol. 77, No. 1, pp. 139–141, Jul. 3, 2000.

Bernard, Allen, "A Big Name in Chips Helps Coatue in Molecular Memory Race," Aug. 27, 2000, www.nanoelectronicsplanet.com/features/article/0,4028,6571–1452831,00.html.

Chen, J. et al., "Room–temperature Negative Differential Resistance in Nanoscale Molecular Junctions," *Applied Physics Letters*, vol. 77, No. 8, Aug. 21, 2000.

Collier, C. P. et al., "Electrically Configurable Molecular-Based Logic Gates," *Science*, vol. 285, pp. 391–394, Jul. 16, 1999.

Gannon, Andrew, "Toward the Next Generation CD," *Physical Review Focus*, Feb. 16, 2000.

Gao, II. .J. et al., "Reversible Nanometer–Scale Conductance Transitions in an Organic Complex," *Physical Review Letters*, vol. 84, No. 8, pp. 1780–1783, Feb. 21, 2000.

Gao, H. .J. et al., "Using a New Kind of Organic Complex System of Electrical Bistability for Ultrahigh Density Data Storage," *J. Vac. Sci. Technol.* B vol. 15, No. 4, pp. 1581–1583, Jul./Aug. 1997.

International Search Report, PCT/RU01/00334, search completed Feb. 14, 2002.

International Search Report, PCT/US02/14236, search completed Aug. 14, 2002.

International Search Report, PCT/US02/14237, search completed Sep. 9, 2002.

International Search Report, PCT/US02/14238, search completed Aug. 9, 2002.

International Search Report, PCT/US02/14239, search completed Aug. 20, 2002.

International Search Report, PCT/US02/14269, search completed Mar. 27, 2003.

International Search Report, PCT/US02/14270, search completed Mar. 28, 2003.

Japanese patent abstract of publication No. 01–103137, Apr. 20, 1989.

Japanese patent abstract of publication No. 01278781, Nov. 9, 1989.

Japanese patent abstract of publication No. 61107723, May 26, 1986.

Japanese patent abstract of publication No. 63293729, Nov. 30, 1998.

Krieger, Ju. H. et al., "Molecular Analogue Memory Cell Based on Electrical Switching and Memory in Molecular Thin Films," *Synthetic Materials*, 7730 (2000), pp. 1–4.

Krieger, Juri H. et al., "Molecular Analogue Memory Cell," *Sixth Foresight Conference on Molecular Nanotechnology*, Santa Clara, California, Nov. 12–15, 1998.

Krieger, Yu. G. et al., "Study of Test Structures of a Molecular Memory Element," *Institute of Inorganic Chemistry*, Siberian Branch, Russian Academy of Sciences. Translated from *Zhurnal Strukturnoi Khimii*, vol. 34, No. 6, pp. 152–156, Nov.–Dec. 1993. Original article submitted Apr. 27, 1993.

Krieger, Yu. G., "Molecular Electronics: Current State and Future Trends," *Journal of Structural Chemistry*, vol. 34, No. 6, pp. 896–904, Nov.–Dec. 1993.

Krieger, Yu. H., "Structural Instability of One–Dimensional Systems as a Physical Principle Underlying the Functioning of Molecular Electronic Devices," *Journal of Structural Chemistry*, vol. 40, No. 4, pp. 594–619, Jul.–Aug. 1999.

Kurita, Ryo et al., "Field Modulation Effects on Charge–Density–Wave Conduction in $NbSe_3$," *Physica B*, 284–288 (2000), pp. 1161–1662.

Ma, L. P. et al., "Data Storage with 0.7 nm Recording Marks on a Crystalline Organic Thin Film by a Scanning Tunneling Microscope," *Applied Physics Letters*, vol. 73, No. 6, pp. 850–852, Aug. 10, 1998.

MA, L.P. et al., "Nanometer–Scale Recording on an Organic Complex Thin Film With a Scanning Tunneling Microscope," *Applied Physics Letters*, vol. 69, No. 24, pp. 3752–3753, Dec. 9, 1996.

Machida, Yasuhiko et al., "Electrical Switching in Evaporated Lead Phthalocyanine Films" *Japanese Journal of Applied Physics*, vol. 28, No. 2, pp. 297–298, Feb. 1989.

Ovshinsky, Stanford R., "Localized States in the Gap of Amorphous Semiconductors," *Physical Review Letters*, vol. 36, No. 24, pp. 1469–1472, Jun. 14, 1976.

Potember, R. S. et al., "Electrical Switching and Memory Phenomena in Cu–TCNQ Thin Films," *Applied Physics Letters*, vol. 34, No. 6, pp. 405–407, Mar. 15, 1979.

Reed, M.A. et al., "Molecular Random Access Memory Cell," *Applied Physics Letters*, vol. 78, No. 23, pp. 3735–3737, Jun. 4, 2001.

Rossel, C. et al., "Electrical Current Distribution Across a Metal–Insulator–Metal Structure During Bistable Switching," Apr. 24, 2001.

Rotman, David, "Molecular Memory," *Technology Review*, May 2001.

*Semiconductor Times*, pp. 5–6, Jul. 2002.

Stikeman, Alexandra, "Polymer Memory: The Plastic Path to Better Data Storage," *Technology Review*, p. 31, Sep. 2002.

Zhou, C. et al., "Nanoscale Metal/Self–Assembled Monolayer/Metal Heterostructures," *Applied Physics Letters*, vol. 71, No. 5, pp. 611–613, Aug. 4, 1997.

* cited by examiner

ADDRESSABLE AND ELECTRICALLY REVERSIBLE MEMORY SWITCH

RELATED APPLICATIONS

This application contains subject matter related to the subject matter disclosed in copending U.S. Provisional Patent Application Ser. No. 60/289,057, filed on May 7, 2001, entitled "Electrically Addressable Memory Switch".

FIELD OF THE INVENTION

The invention relates to a switching device, and more particularly, to a switching device having a memory function, wherein the memory/switching device can be addressed and the switching state reversed by externally applying an electric field.

BACKGROUND OF THE INVENTION

Various types of electrically addressable memory devices for computer data storage are known in the art. Most of these devices store a data bit as a charge in a capacitor. The charge state can be read out and the output signal used to control processes in a computer processor. Most of these devices require complex silicon processing steps and a dedicated device architecture which depends on memory type.

Memory devices are distinguished by their speed and data retention characteristic. Dynamic random access memory (DRAM) is a volatile memory characterized by a destructive read. This means that it is necessary to supply voltage to the memory bits at all times, or the information will disappear. Furthermore, each memory element has associated with it a transistor. Static random access memory (SRAM) stores data in a bistable flip-flop, commonly consisting of cross-coupled inverters. It is called "static" because it will retain a value as long as power is supplied. It is still volatile, i.e. it will lose its contents when the power is switched off, in contrast to ROM. SRAM is usually faster than DRAM, but each bit requires several transistors (about six), so that a lesser number of bits of SRAM fit in the same area as compared to DRAM.

Erasable programmable read only memory (EPROM) is a type of storage device in which the data is determined by electrical charge stored in an isolated ("floating") MOS transistor gate. The isolation is good enough to retain the charge almost indefinitely (more than ten years) without an external power supply. The EPROM is programmed by "injecting" charge into the floating gate, using a technique based on the tunnel effect. This requires higher voltage than in normal operation (usually 12V–25V). The floating gate can be discharged through UV-illumination or electrically (EEPROM). Usually bytes or words can be erased and reprogrammed individually during system operation. EEPROM is more expensive and less dense than RAM. It is appropriate for storing small amounts of data which is changed infrequently. Another known non-volatile memory device is a ferromagnetic RAM (Fe-RAM), wherein the individual storage cells do not require a dedicated transistor.

It would therefore be desirable to provide a device for data storage and data manipulation that is easy and inexpensive to manufacture and has a predictable memory and/or switching effect.

SUMMARY OF THE INVENTION

The present invention provides a novel switching device that comprises first and second electrodes, an active region provided between the first and second electrodes and including a molecular system, and a control electrode for controlling an electric field applied to the active region. Ionic complexes may be distributed in the molecular system.

In accordance with an embodiment of the present invention, the electric field is controlled for switching the active region between a high-impedance state or off state and a low-impedance state or on state. The reproducible switching between the off state and the on state may be achieved by applying an electrical field with a predetermined polarity and magnitude for a predetermined time.

In particular, the active region may be switched from the off state into the on state when a voltage of a first polarity is applied between the control electrode and the first and second electrodes. As a result, an electrically conducting channel is provided between the first and second electrodes. The active region may be switched back to the off state when a voltage of a second polarity opposite with respect to the first polarity is applied between the control electrode and the first and second electrodes.

The ionic complexes dissociate under the influence of an external applied electric field, thereby changing the electrical conductivity of the device. The molecular matrix can be polyconjugated compounds, aromatic and heterocyclic molecules, quasi-one-dimensional complexes, such as phthalocyanines and porphyrins, and anisotropic inorganic materials, such as $NbSe_3$. Each of the ionic complexes may include, for example, ions of Na and Cl or ions of Cs and Cl.

The active region in accordance with an embodiment of the present invention may provide stable and metastable modes of operation. Intensity of an electric field required to switch the switching device between the on and off states in the stable mode is higher than in the metastable mode. The on-state impedance of the active region in the stable mode is lower than in the metastable mode, whereas the switching time as well as data storage time in the stable mode is longer than in the metastable mode.

In accordance with an embodiment of the invention, the first and second electrodes of the switching device may be provided on an insulating substrate. The active region also may be provided on the substrate so as to have an electrical contact with the first and second electrodes. The control electrode may be formed on an insulating layer covering the active region.

In accordance with another embodiment of the invention, no insulating substrate is required. The active region may be sandwiched between the first electrode and the second electrode. The control electrode may be provided on the insulating layer covering the first electrode.

In accordance with another aspect of the invention, a memory switch is provided with a gate terminal, at least two signal terminals, and an active element including a molecular system and ionic complexes distributed in the system. The active element electrically connected between the signal terminals is responsive to a signal applied to the gate terminal for switching between an on state and an off state.

The foregoing and other features, aspects and advantages of the present invention will become more apparent from the following detailed description of the present invention when taken in conjunction with the accompanying drawings.

BRIEF DESCRIPTION OF THE DRAWINGS

The following figures depict certain illustrative embodiments of the invention. These depicted embodiments are to be understood as illustrative of the invention and not as limiting in any way.

DETAILED DESCRIPTION OF THE INVENTION

Figure 1:
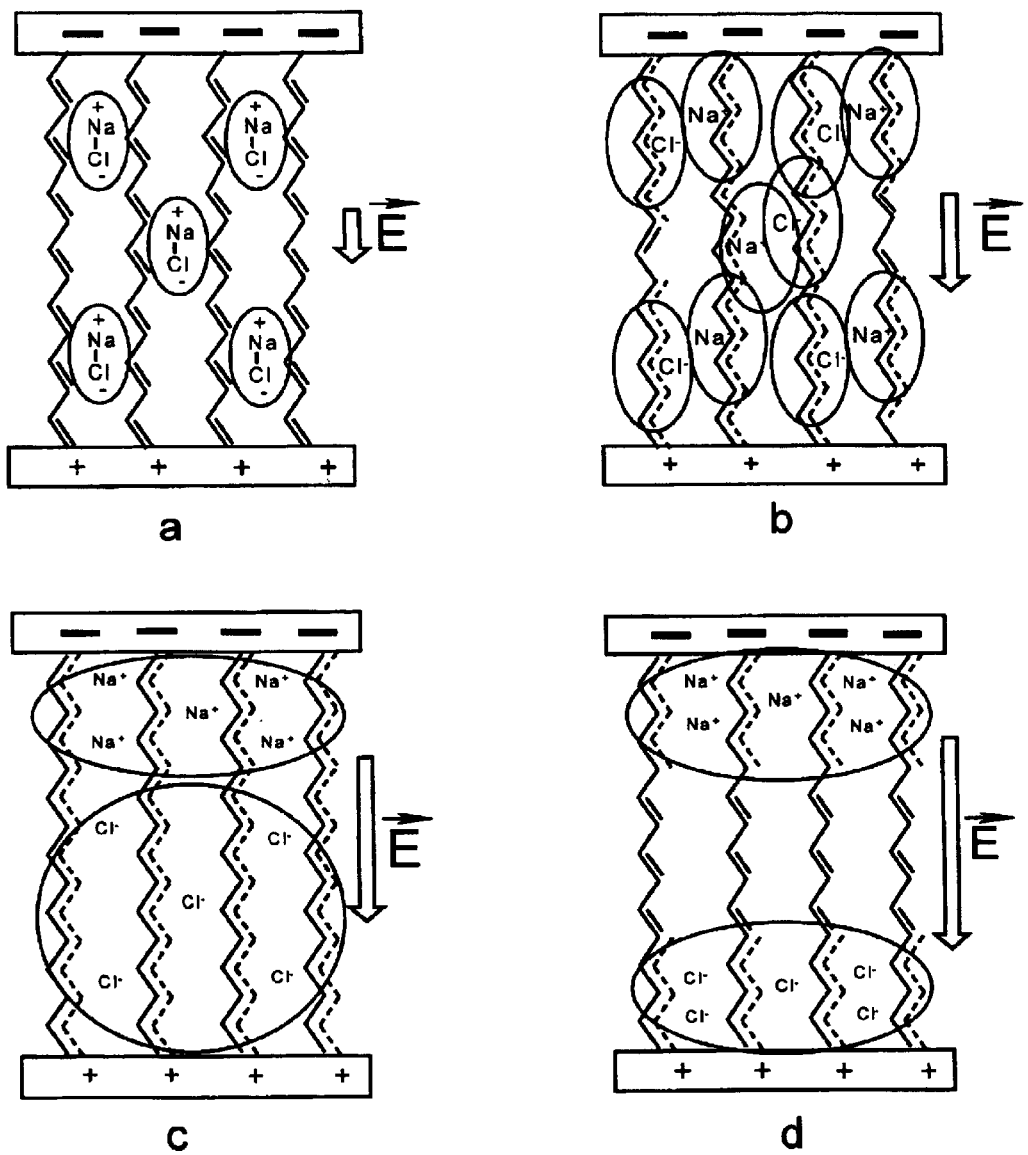
FIGS. 1a–1d show a simplified structure of a molecular composite memory cell in various operational states.

The present invention addresses and solves problems related to providing a novel switching device that may have a memory function. The present invention overcomes these problems in part, by the provision of an active region electrically connected between a pair of signal terminals. The active region becomes conductive to connect the signal terminals when a voltage of predetermined value and polarity is applied during a predetermined time between a control terminal and the signal electrodes.

The active region that exhibits a reproducible switching and memory effect applicable in macroscopic devices is made of a molecular system with ionic complexes distributed through the molecular system. These ionic complexes are dissociable in the molecular system under the influence of an applied electrical field.

The molecular composite material of the active region exhibits structural electronic instability in one dimension and enables static and dynamic control over the conductivity of such molecular systems. The mechanism for the memory and switching effect appears to be related to the structural electronic instability of one-dimensional molecular systems and associated with the dissociation of molecules and/or displacement of atoms in an external electrical field.

The development of molecular electronics stimulated the more detailed research of electrophysical characteristics of thin molecular films which offer new physical effects that may result in new technologies for electrical switching and memory applications. Although first reported in the 1960's, a generally accepted interpretation of such phenomena is still lacking. This is partly due to the non-reproducibility of the results, even when using identical compounds.

A number of different materials may be used as the molecular composite material. Exemplary materials are described below, but are also discussed in an article by Yu H. Krieger, entitled, "Structural Instability of One-Dimensional Systems As A Physical Principle Underlying The Functioning of Molecular Electronic Devices", Journal of Structural Chemistry, Vol. 40, No. 4, 1999 (Yu H. Krieger), expressly incorporated by reference herein.

Many molecular memory switches can include one-dimensional conductive molecular systems exhibiting structural instability. (Peierls-effect). These tend to have an S-shaped (reentrant) voltage-current characteristic with memory. The impedance of such memory switches can be between ~10 MΩ and ~100 Ω, depending on the switching condition.

There are two predominant types of structural organization of such systems. First, these are strands of linear conjugated polymers, which are weakly bonded to each other and whose mutual arrangement is generally poorly organized. Second, these are crystal structures, where the individual molecules form one-dimensional columns and interact with each other much more actively than molecules from different columns do. Recently, molecular systems of both types were synthesized.

Polyconjugated systems primarily involve polyvinylenes, i.e., polymers with an acyclic conjugation system, in which the one-dimensional character of structure is dictated by the mechanism of conjugation in linear macromolecules. Polyacetylene is a classical representative of this class of polymers. Its electronic structure is a prototype for many other conjugated polymers.

Another wide class of molecular compounds formed from aromatic and heterocyclic molecules which possess high electric conductivity due to π-bonds between molecules. Such molecular systems are called π-complexes or charge transfer complexes, with those systems whose structure involves isolated one-dimensional columns or strands possessing pronounced electro-physical properties of interest for switching an memory applications. Molecular charge transfer complexes are donor-acceptor systems formed from two molecules: one possessing donor and another acceptor properties. Among the well-defined complexes with a one-dimensional structure, tetra-cyano-quino-dimethane (TCNQ) are planar molecules with unsaturated bonds, arranged in a crystal as parallel stacks forming a quasi-one-dimensional system.

In another class of one-dimensional systems, the cations are dynamically disordered. It involves molecular compounds having the general formula $(TMTSF)_2X$. Transition metal salts of $K_2 Pt(CN)_4 Br_{0.3} \times 3H_2O$ (KCP) type are also the typical representatives of mixed-valence quasi-one-dimensional complexes, as are phthalocyanines and porphyrins. Moreover, pure inorganic compounds, such as $NbSe_3$, are also interesting examples of compounds with quasi-one-dimensional structure.

An exemplary molecular composite that forms part of a simplified molecular memory cell (MC) is shown in FIGS. 1a–1d. The molecular composite includes a quasi-one-dimensional—or at least structurally and electrically anisotropic—molecular matrix, wherein ionic complexes are distributed in the matrix. Polyconjugated compounds, such as the exemplary quasi-one-dimensional systems described above, for example, polyphenylacetylene, can be used as the anisotropic molecular matrix. The ionic complex can be a salt, such as sodium chloride (NaCl), cesium chloride (CsCl), or any other material that can dissociate in an applied electric field. The exemplary anisotropic molecular matrix is depicted in FIGS. 1a–d as consisting of an assembly of chain-like molecules oriented perpendicular to the electrode surfaces. However, other orientations of those molecules or of anisotropic "channels" are possible as long as a charge separation of the type depicted in FIGS. 1a–d is enabled.

While not being bound by theory, the following is currently believed by the inventors to describe the mechanism for the conductivity change of the molecular composite material. Electric switching in the molecular thin films depicted in FIGS. 1a–d is characterized by the existence of two stable states, a high impedance state (off state) and a low impedance state (on state). The impedance of this off state is usually more than ~10 MΩ. Switching from the off state to the on state occurs when intensity of an applied electric field exceeds a threshold value. The impedance of this on state is less than ~100 Ω. A transition from the on state back to the off state takes place when the polarity of the applied electric field is reversed.

Two modes of the memory cell operation can be identified: the metastable mode (FIG. 1b) and stable mode (FIG.

1c). The stable mode of the memory cell operation may be characterized by a high threshold voltage level for switching between the off state and the on state (in the range of about 3–10V), low impedance of the on state (less than 100 Ω), long switching time (1 ms and more) and long storage time (more than two month). Some memory cells exhibit substantially unchanged electrical properties after storage for six years.

Conversely, the metastable mode of the memory cell function is characterized by a low threshold voltage level for switching between the off state and the on state (in the range of about 0.1–0.5V), high impedance of the on state (wide region, about 1 kΩ—1 MΩ), short switching time (less than 1 μs), and short storage time (between about 10 s and several hours).

FIG. 1a illustrates the off state, where the electrical conductivity is essentially zero, assuming that the anisotropic molecular matrix itself is a good electrical insulator. When an external electric field E is applied, as indicated in FIG. 1b, the sodium salt dissociates into sodium and chlorine ions, and the ions are displaced from their original position in the anisotropic molecular matrix, resulting in an increase in the electrical conductivity of the MC (on state) to the metastable state. Upon further increase of the electric field, the ions become more strongly separated (FIG. 1c), accompanied by a still further increase in the conductivity of the MC, which attains the above-described stable state. When a very large field is applied over a long time, the anions and cations accumulate at the electrodes (FIG. 1d), resulting in a sharp decrease in the electrical conductivity of the MC due to the absence of mobile charges (off state).

As presently understood, the charges responsible for the electrical conductivity in the discussed example are not the $Na^+$ and $Cl^-$ ions (ionic conductivity), but rather the electrons and/or holes present in the material. The electrons and/or holes can migrate through the material by a process referred to as "variable range hopping conduction." It appears that the $Na^+$ and $Cl^-$ ions affect the potential barrier so as to increase the carrier mobility. However, this theoretical explanation is not to be understood as limiting the scope of the subject matter described in the present specification.

Figure 2:
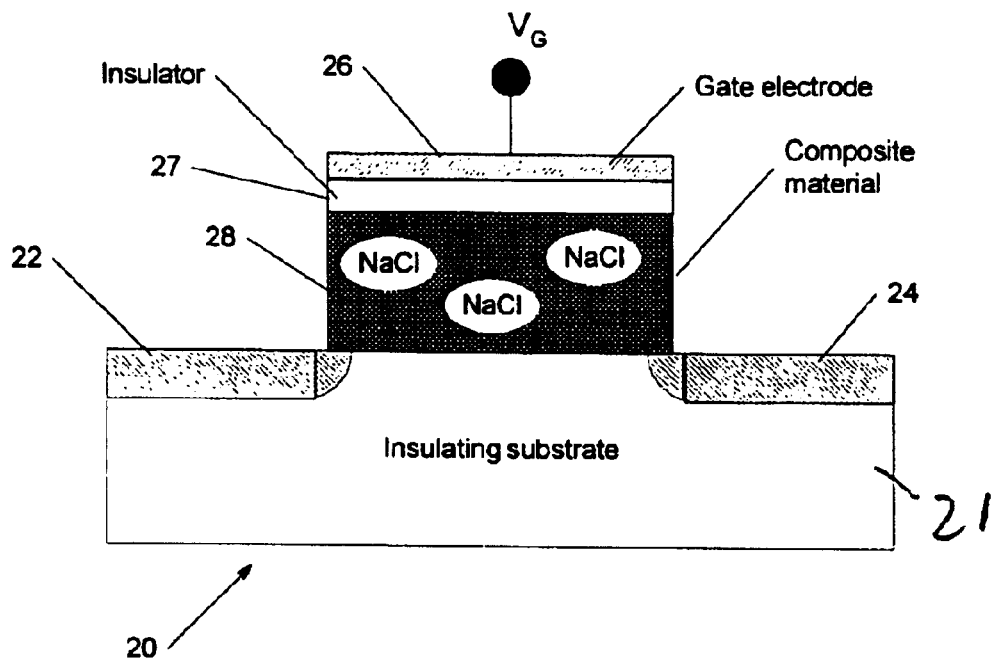
FIG. 2 illustrates an off state of an exemplary switching device in accordance with an embodiment of the present invention.
Figure 3:
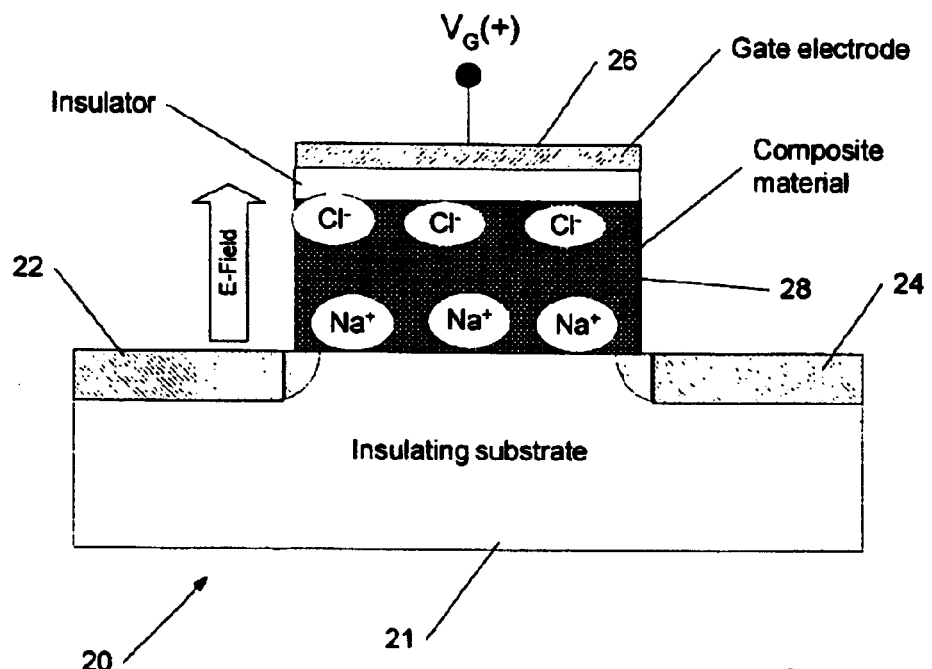
FIG. 3 illustrates an on state of the exemplary switching device of FIG. 2.

The observations described above with reference to FIG. 1 can be implemented in a gate-controlled switching device in accordance with embodiments of the present invention illustrated in FIGS. 2 and 3. Referring now to FIG. 2, an addressable switching device 20 according to one embodiment of the invention includes an insulating substrate 21, for example, a glass or sapphire substrate, with electrodes 22, 24 that resemble the source and drain of a field-effect transistor (FET), formed on the substrate 21. An active layer 28 made of composite material of the type described with reference to FIGS. 1a–1d is deposited over the electrodes 22, 24. An insulator 27, similar to the gate oxide of an FET, is deposited on the composite material layer 28, followed by a gate electrode 26 that can be made, for example, of aluminum. If a voltage lower than a threshold level required for switching the active layer 28 from the off state to the on state" described in connection with FIGS. 1a–1d is applied between the gate electrode 26 and the electrodes 22 and 24, respectively, then the composite layer 28 is insulating and no current can flow between the electrode 22 and the electrode 24.

As depicted in FIG. 3, when a positive gate voltage $V_G$ exceeding the threshold level is applied between the gate electrode 26 and the electrodes 22, 24, then the ionic NaCl complex dissociates into $Na^+$ and $Cl^-$ ions, with the negatively charged $Cl^-$ ions becoming more concentrated near the gate electrode and the positively charged $Na^+$ ions becoming more concentrated near the interface between the composite material 28 and the insulating substrate 21. For example, to switch the device 26 into its conducting state (on state), a potential of 0 V may be applied to the gate electrode 26, –5 V may be applied to the electrode 22, and –10 V may be applied to the electrode 24.

In other words, the electric field causes an accumulation of positive charges in the composite material near the insulating substrate. As discussed above, these positive charges appear to facilitate conductivity in the composite material, thereby providing a conducting channel in the active layer 28 through which electric charges can pass between the electrode 22 and the electrode 24. Hence, the device 20 switches to its conducting state when an electric field is applied to the gate electrode. Depending on whether the composite material is in a metastable or a stable mode, the high conductivity state of the active layer 28 can persist for several seconds, or even months or years.

The device 20 can be restored to its non-conducting state (off state) by applying a reverse (negative) voltage between the gate electrode 26 and the electrodes 22, 24. For example, to switch the device 20 into the off state, a potential of –20 V may be applied to the gate electrode, whereas potentials of –5 V and –10 V are supplied to the electrodes 22 and 24, respectively.

This arrangement thus produces a switch with a memory function or a memory switch which can be utilized either as a memory device or as a switching device. When the device 20 is used as a memory device, writing may be performed by applying a voltage between the gate electrode 26 and electrodes 22, 24, and reading may be carried out by detecting electrical conductivity between the electrodes 22 and 24.

Figure 4:
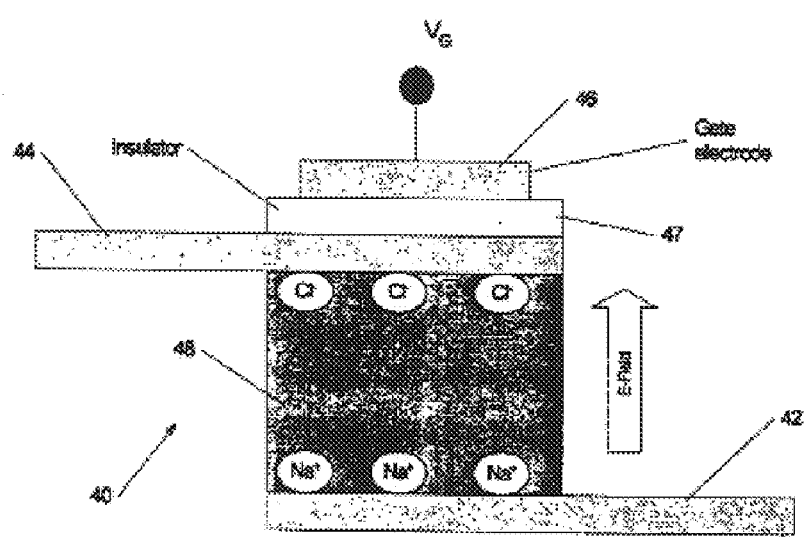
FIG. 4 illustrates an on state of an exemplary switching device in accordance with another embodiment of the present invention.

Referring now to FIG. 4, a switching device 40 in accordance with another embodiment of the present invention is modified with respect to the device 20 illustrated in FIGS. 2 and 3 so that an active layer 48 made of composite material of the type described with reference to FIGS. 1a–1d is disposed directly between a bottom electrode 42 and a top electrode 44, thereby obviating the need for a substrate. The electrode 42 can be, for example, a row electrode of a memory or switching device, and the electrode 44 can be a column electrode. A gate electrode 46 is applied, for example, on top of the electrode 44, with an insulating layer 47 providing electrical isolation between the electrode 46 and the electrode 44.

As in the embodiment depicted in FIG. 4, the ionic NaCl complex dissociates into $Na^+$ and $C^-$ ions, when a positive voltage $V_G$ is applied between the gate electrode 46 arid the electrode 42 to make the potential at thc elcetrode 44 more positive with respect to the potential at the electrode 42. The negatively charged $Cl^-$ ions become more concentrated near the top electrode 44 and the positively charged $Na^+$ ions become more concentrated near the bottom electrode 42. As a result, the electrical conductivity of the composite material layer 48 increases so that electrical current can pass between the electrode 42 and the electrode 44. This state corresponds to the on statc of the device 40.

The device 40 can be restored to its non-conducting state (off state) by applying a reverse (negative) voltage between the gate electrode 46 and the electrode 42. The device 40 may be a three-terminal memory device, wherein the write cycle involves applying a voltage between the gate electrode 46 and the electrode 42. The device 40 can be read out by detecting the electrical conductivity between the electrodes 42 and 44.

While the invention has been disclosed in connection with the preferred embodiments shown and described in detail, various modifications and improvements thereon will become readily apparent to those skilled in the art.

What is claimed is:

1. A switching device comprising:
    first and second electrodes,
    an active region provided between the first and second electrodes and including a molecular system that comprises ionic complexes distributed there through,
    a control electrode for controlling an electric field applied to the active region, and
    an insulating layer adjacent the control electrode.
2. The switching device of claim 1, wherein the active region has an on state and an off state.
3. The switching device of claim 2, wherein the electric field is cotrolled for switching the active region between the on state and the off state.
4. The switching device of claim 2, wherein the active region is configured for switching from the off state into the on state when a voltage of a first polarity is applied between the control electrode and the first and second elcetrodes.
5. The switching device of claim 4, wherein the active region is configured for switching from the on state to the off state when a voltage of a second polarity opposite with respect to the first polarity is applied between the control electrode and the first and second electrodes.
6. The switching device of claim 2, wherein the active region is configured for providing a conducting channel between the first and second electrodes in the on state.
7. The switching device of claim 1, wherein the active region has a low-impedance state and a high-impedance state.
8. The switching device of claim 7, wherein the electric field is controlled for switching the active region between the low-impedance state and the high-impedance state.
9. The switching device of claim 7, wherein the active region is configured for switching from the high-impedance state into the low-impedance state when a voltage of a first polarity is applied between the control electrode and the first and second electrodes.
10. The switching device of claim 9, wherein the active region is configured for switching from the low-impedance state to the high-impedance state when a voltage of a second polarity opposite with respect to the first polarity is applied between the control electrode and the first and second electrodes.
11. The switching device of claim 3, wherein the active region is configured to provide first and second modes of operation.
12. The switching device of claim 11, wherein impedance of the active region in the on state in the first mode is lower than in the second mode.
13. The switching device of claim 11, wherein switching time between the on state and the off state in the first mode is longer than in the second mode.
14. The switching device of claim 11, wherein intensity of electric field required for switching the active region in the first mode is higher than in the second mode.
15. The switching device of claim 1, wherein each of the ionic complexes includes ions of Na and Cl.
16. The switching device of claim 1, wherein each of the ionic complexes includes ions of Cs and Cl.
17. The switching device of claim 1, wherein the molecular system includes a quasi-one-dimensional molecular matrix.
18. The switching device of claim 1, wherein the molecular system includes a structurally and electrically anisotropic molecular matrix.
19. The switching device of claim 1, wherein the molecular system includes a polyconjugated compound.
20. The switching device of claim 1, wherein the molecular system includes aromatic molecules.
21. The switching device of claim 1, wherein the molecular system includes heterocyclic molecules.
22. The switching device of claim 1, wherein the molecular system includes porphyrin.
23. The switching device of claim 1, wherein the molecular system includes phtalocyanines.
24. The switching device of claim 1, wherein the molecular system includes anisotropic inorganic material.
25. The switching device of claim 1, wherein the insulating layer is sandwiched between the control electrode and the active region.
26. The switching device of claim 25, further comprising a substrate.
27. The switching device of claim 26, wherein the first and second electrodes are provided on the substrate.
28. The switching device of claim 27, wherein the active region is provided on the substrate and has an electrical contact with the first and second electrodes.
29. The switching device of claim 1, wherein the insulator is sandwiched between the control electrode and the first electrode.
30. The switching device of claim 29, wherein the active region is sandwiched between the first electrode and the second electrode.
31. A memory switch comprising:
    a gate terminal,
    at least two signal terminals, and
    an active element electrically connected between the signal terminals and responsive to a signal applied to the gate terminal for switching between an on state and an off state, the active element including a molecular system and ionic complexes comprising Na ions and Cl ions distributed in the system.
32. The memory switch of claim 31, wherein impedance of the active element in the on state is lower than in the off state.
33. The memory switch of claim 31, wherein the active element is configured to switch between the on state and off state when intensity of an electric field applied to the active element exceeds a threshold value.
34. The memory switch of claim 33, wherein the active element is configured to switch from the off state to the on state when the electric field has a first polarity.
35. The memory switch of claim 34, wherein the active element is configured to switch from the on state to the off state when the electric field has a second polarity opposite with respect to the first polarity.
36. The memory switch of claim 31, wherein an electric field applied to the active element provides addressing of the memory switch.
37. The memory switch of claim 31, further comprises an insulating substrate.
38. The memory switch of claim 37, wherein the signal terminals are provided on the substrate.
39. The memory switch of claim 38, wherein the active element is provided on the substrate between the signal terminals.

40. The memory switch of claim 39, further comprising an insulator provided between the gate terminal and the active element.

41. The memory switch of claim 31, further comprising an insulator provided between the gate terminal and one of the signal terminals.

42. The memory switch of claim 41, wherein the active element is provided between the signal terminals.

43. The memory switch of claim 31, having first and second modes of switching.

44. The memory switch of claim 43, wherein intensity of an electric field applied to the active element for switching the memory switch in the first mode is higher than in the second mode.

45. The memory switch of claim 44, wherein switching time in the first mode is higher than in the second mode.

46. The memory switch of claim 44, wherein data storage time in the first mode is higher than in the second mode.

47. A method of switching a device having a control terminal, a pair of signal terminals, and an active element electrically connected between the signal terminals and including a molecular system; the method comprising the steps of:

applying to the control terminal a signal having a first polarity with respect to the signal terminals to switch the device from an off state to an on state, impedance of the active element in the on state being lower than in the off state, and selectively applying to the control terminal a signal having a second polarity with respect to the signal terminal, opposite with respect to the first polarity, to switch the device from the on state to the off state.

48. The method of claim 47, wherein the active element further comprises ionic complexes distributed in the molecular system.

* * * * *